(12) United States Patent
Tokumaru et al.

(10) Patent No.: US 10,167,199 B2
(45) Date of Patent: Jan. 1, 2019

(54) METHOD FOR MANUFACTURING HIGHLY PURE SILICON, HIGHLY PURE SILICON OBTAINED BY THIS METHOD, AND SILICON RAW MATERIAL FOR MANUFACTURING HIGHLY PURE SILICON

(75) Inventors: Shinji Tokumaru, Tokyo (JP); Masataka Hiyoshi, Tokyo (JP); Jiro Kondo, Tokyo (JP); Hitoshi Dohnomae, Tokyo (JP); Yutaka Kishida, Tokyo (JP); Shigeru Nakazawa, Tokyo (JP); Kozo Onoue, Tokyo (JP)

(73) Assignee: Silicio Ferrosolar S.L., Madrid (ES)

( * ) Notice: Subject to any disclaimer, the term of this patent is extended or adjusted under 35 U.S.C. 154(b) by 852 days.

(21) Appl. No.: 14/383,321

(22) PCT Filed: Mar. 8, 2012

(86) PCT No.: PCT/JP2012/055937
§ 371 (c)(1),
(2), (4) Date: Oct. 16, 2014

(87) PCT Pub. No.: WO2013/132629
PCT Pub. Date: Sep. 12, 2013

(65) Prior Publication Data
US 2015/0028268 A1 Jan. 29, 2015

(51) Int. Cl.
*C01B 33/021* (2006.01)
*C30B 21/00* (2006.01)
*C01B 33/037* (2006.01)
*C30B 29/06* (2006.01)
*C30B 11/00* (2006.01)
*H01L 31/0288* (2006.01)
*C30B 13/10* (2006.01)

(52) U.S. Cl.
CPC .......... *C01B 33/037* (2013.01); *C01B 33/021* (2013.01); *C30B 11/002* (2013.01); *C30B 11/007* (2013.01); *C30B 29/06* (2013.01); *H01L 31/0288* (2013.01); *C30B 13/10* (2013.01); *C30B 21/00* (2013.01)

(58) Field of Classification Search
CPC ... C01B 33/037; C01B 33/021; C30B 11/002; C30B 29/06; C30B 13/10; C30B 21/00
See application file for complete search history.

(56) References Cited

U.S. PATENT DOCUMENTS 5,972,107 A * 10/1999 Schmid ................. C01B 33/037
117/204
7,887,633 B2 * 2/2011 Kirscht

FOREIGN PATENT DOCUMENTS

| JP | 63-050308 A | 3/1988 | | |
|---|---|---|---|---|
| JP | 05-074783 A | 3/1993 | | |
| JP | 2008-127254 A | 6/2008 | | |
| JP | 2008-156227 A | 7/2008 | | |
| JP | 2011-524849 A | 9/2011 | | |
| WO | 2006/093089 A1 | 9/2006 | | |
| WO | 2006/104107 A1 | 10/2006 | | |
| WO | WO 2010127184 A1 * | 11/2010 | ........... | C01B 33/037 |
| WO | WO-2010127184 A1 * | 11/2010 | ........... | C01B 33/037 |

* cited by examiner

*Primary Examiner* — Haidung D Nguyen
(74) *Attorney, Agent, or Firm* — Ladas & Parry LLP

(57) ABSTRACT

Provided are: a method for manufacturing a highly pure silicon by unidirectional solidification of molten silicon, that can inexpensively and industrially easily manufacture highly pure silicon that has a low oxygen concentration and low carbon concentration and is suitable for applications such as manufacturing solar cells; highly pure silicon obtained by this method; and silicon raw material for manufacturing highly pure silicon. A method for manufacturing highly pure silicon using molten silicon containing 100 to 1000 ppmw of carbon and 0.5 to 2000 ppmw of germanium as the raw material when manufacturing highly pure silicon by unidirectionally solidifying molten silicon raw material in a casting container, the highly pure silicon obtained by this method, and the silicon raw material for manufacturing the highly pure silicon.

10 Claims, No Drawings

METHOD FOR MANUFACTURING HIGHLY PURE SILICON, HIGHLY PURE SILICON OBTAINED BY THIS METHOD, AND SILICON RAW MATERIAL FOR MANUFACTURING HIGHLY PURE SILICON

RELATED APPLICATION INFORMATION

Thia application is a 371 of International Application PCT/JP2012/055937 filed 8 Mar. 2012 entitled "Method For Manufacturing Highly Pure Silicon, Highly Pure Silicon Obtained By This Method, And Silicon Raw Material For Manufacturing Highly Pure Silicon", which was published on 12 Sep. 2013, with International Publication Number WO 2013/132029 A1, the content of which is incorporated herein by reference.

TECHNICAL FIELD

The present invention relates to a production method for producing high purity silicon that can be optimally applied to the manufacture of solar cells by unidirectional solidification of molten silicon raw materials, high purity silicon obtained by that method and the silicon raw materials for producing the high purity silicon used in that method.

PRIOR ART TECHNOLOGY

High quality silicon is essential for the production of solar cells, and this kind of high quality silicon is generally produced by unidirectional solidification of molten silicon from bottom to top by gradually extracting heat out of the molding vessel from the bottom after melting silicon raw materials in the molding vessel or pouring into the molding vessel molten silicon obtained by melting silicon in another vessel (for example, please refer to Patent Literature Reference 1).

When molten silicon is solidified unidirectionaliy in a molding vessel in this manner, metallic impurity elements like Fe, Ni and Ti that are contained in the molten silicon and lower the carrier lifetime are segregated into the upper part of the silicon that has solidified in the molding vessel, and by removing the part where the impurities have been concentrated due to this segregation, there is the merit of obtaining highly purified silicon.

In addition, with regard to the molding vessel into which this molten silicon is placed, molds made of quartz have become mainstream in industrial production, and when they are used, after coating the inner surface with a release agent prepared by kneading powders of silicon nitride, silicon oxide and silicon carbide and the like with a binder such as polyvinyl alcohol (PVA), the mold is calcined in an oxidising atmosphere (for example, please refer to Patent Literature Reference 2).

Incidentally, when the molten silicon comes into contact with the inner surface of the quartz molding vessel, the $SiO_2$ components therein are dissolved so that the oxygen concentration of the molten silicon particularly near the inner surface of the mold vessel is increased (Non-Patent Literature Reference 1). Moreover, oxygen dissolved into the molten silicon in part goes to form silicon monoxide and that is vaporised from the surface of the molten silicon as a gas, but the partition index of oxygen in molten silicon (segregation index) is almost 1 and during unidirectional solidification of silicon purification is not effected and particularly in the portion far from the surface near the bottom of the molding vessel, the concentration is high and as a result it is taken into the solidified silicon.

Moreover, when the concentration of oxygen in solidified silicon increases, this oxygen combines with dopant boron and forms B—O pairs, and when this is brought into contact with high intensity light, together with the passage of time, the carrier lifetime declines and the so-called "light degradation" phenomenon is produced. Thus, in order to manage this, methods using potassium instead of boron as dopants have been proposed (Patent Literature Reference 3).

This kind of degradation is caused by bonding with oxygen that has solidified in the silicon and boron, but when the oxygen concentration exceeds the solid solubility limits, the oxygen precipitates as a silicon oxide ($SiO_x$) and this becomes the solid solubility limit, or, by fixing at the transition, when using as a silicon wafer for a solar cell, such problems as the decline in the photoelectric conversion ratio are known to be the cause of the decline in solar cell quality. Thus, in order to obtain silicon with a low oxygen concentration, a melting method using plasma melting equipment and charging a nitrogen atmosphere inside the vessel has been proposed (Patent Literature Reference 4).

Moreover, if the concentration of carbon within the silicon is high, the carbon within the silicon becomes a nucleus of the promotion of oxygen precipitation, and when used as a silicon wafer for a solar cell the photoelectric conversion ratio is forced down, and, moreover, carbon itself precipitates as silicon carbide (SiC) and this becomes a cause of increases in leaked current. In addition, slicing and cutting and cutting out the wafers is also the cause of an increase in defective goods due to silicon wafers that have been damaged on the surface and so on.

Several methods have therefore been studied in order to find a solution for these problems, including a method for removing carbon whereby an inert gas carrying an oxidising agent is charged and introduced through a decarbonizing lance (for example, Patent Literature Reference 5), and a method whereby carbon is removed from the molten silicon surface as carbon monoxide gas, by establishing a temperature gradient in the molten silicon (Patent Literature Reference 6), or by applying a magnetic field (Patent Literature Reference 7), methods proposed that remove the local segregation of silicon carbide.

Additionally, it is known that when germanium is added to silicon, this increases its quality as a solar cell, and the improvement of the photoelectric conversion rate by addition of between 0.5~5% by weight. (Non-Patent Literature Reference 2) or the fact that by addition of 50~200 ppmw the durability is observed to improve (Patent Literature Reference 8) has been reported.

PRIOR ART REFERENCES

Patent Literature References

Patent Literature Reference 1 Japanese Published Patent 1988-166, Rep. No. 711
Patent Literature Reference 2 Japanese Published Patent 2007-261, Rep. No. 832
Patent Literature Reference 3 Japanese Published Patent 2001-064, Rep. No. 007
Patent Literature Reference 4 Japanese Published Patent 1999-314, Rep. No. 911
Patent Literature Reference 5 Japanese Published Patent 1990-267, Rep. No. 110
Patent Literature Reference 6 Japanese Published Patent 2008-127, Rep. No. 254

Patent Literature Reference 7 Japanese Published Patent 2008-127, Rep. No. 268

Patent Literature Reference 8 Japanese Published Patent 2011-524, Rep. No. 849

Non-Patent Literature References

Non-Patent Literature Reference 1: Journal of Crystal Growth 2008, Vol. 310 p. 2204

Non-Patent Literature Reference 2: Journal of Applied Physics 2004, Vol. 96 p. 1238

DISCLOSURE OF THE PRESENT INVENTION

The Problems the Present Invention Seeks to Solve

In the event that silicon for use in manufacturing solar cells is made by unidirectional solidification of molten silicon, then not only must the metallic impurities be removed from the silicon, but as stated above, if the concentrations of carbon and oxygen become too high, then due to these things themselves, or the precipitation caused by them, the quality of the solar cells declines.

Thus, as stated in Patent Literature Reference 5, if for the purpose of reducing carbon concentration an oxidising agent or an oxidative gas is introduced to the molten silicon, the oxygen content increases, or even if silicon raw materials from which oxygen has been removed according to the methods of Patent Literature Reference 4 are used, then to the extent of producing silicon by unidirectional solidification using a quartz molding vessel oxygen is incorporated into the molten silicon.

Moreover, as stated above, a method is offered for using potassium in place of boron in Patent Literature Reference 3, but potassium has a larger atomic weight in comparison to boron and the segregation index compared to that of boron, which is 0.8, is a very small 0.008 and consequently the amount added to create the necessary carrier for solar cells must be very large, and, moreover, during unidirectional solidification most of the potassium is concentrated in the upper portion of the molding vessel together with the other metallic impurities, and thus there is the problem that the amount that can be used is small and the loss is large. Additionally, because it is a liquid at 30° C. or above, there is also the disadvantage that it is difficult to handle.

In addition, due to the fact that if the oxygen concentration exceeds the solid solution limit it will precipitate ($SiO_x$), because in addition to becoming a transition growth inhibitor it will cause a decline in the quality of solar cells in which the photoelectric exchange rate is decreased and the like, it is thought that use of quartz molding vessels may be avoided and carbon molding vessels can be used. However, in the case of quartz molding vessels, following unidirectional solidification of molten silicon, it is possible to obtain silicon in the form of an ingot (silicon ingot) by degrading it, but where a molding vessel made of carbon and particularly constructed as a unit is used, the item is relatively expensive and even a single instance of damage can result in considerable costs being incurred. Moreover, because the coefficient of linear expansion for carbon is very large in comparison with that of release agents silicon nitride and silicon oxide, the release agent peels easily and becomes the cause of adherence of molten silicon to the inner surface of the molding vessel, and, additionally, there is the problem that when a sectionable molding vessel is used, the formation of cracks is facilitated and these become the cause of leakage.

The inventors of the present invention, as a result of consistent research into molding vessels that should solve the various aforementioned problems that occur when producing high purity silicon by unidirectional solidification of molten silicon, that can be used in such applications as solar cell manufacture, have observed that it is possible to lower the oxygen and carbon concentrations in solidified silicon, even in the case where quartz molding vessels that are commonly used in industrial manufacture are used, by using molten silicon containing germanium and carbon at respectively fixed concentrations as the silicon raw material, and that it is possible to manufacture easily and at low cost on an industrial scale high purity silicon that can be prepared into silicon wafers for non-degrading high quality solar cell use, even when boron is added as a dopant, and they have perfected the invention, Accordingly, the objective of the present, invention is to offer a production method for producing high purity silicon by unidirectional solidification of molten silicon, and that has low oxygen concentration and low carbon concentration and that can be accomplished on an industrial scale both easily and at low cost price.

Moreover, as additional objectives of the present invention, the present invention offers a high purity silicon used optimally for applications such as solar cell manufacture with a low oxygen content and a low carbon content, and, in addition, offers a silicon raw material for use in production of high purity silicon that in this manner has low oxygen and carbon concentrations.

Process for Solving the Problems

That is to say, the present invention is a method for producing high purity silicon that produces high purity silicon by unidirectional solidification of raw material molten silicon in a molding vessel, and it is more particularly a production method for high purity silicon characterised in that molten silicon containing carbon at 100~1000 ppmw and germanium at 0.5~2000 ppmw is used as the aforesaid raw material.

Moreover, the present invention is a high purity silicon produced by the aforementioned method, characterised in that it possesses a carbon concentration measured by Fourier Transform Infrared Spectroscopy (FT-IR) of $10 \times 10^{17}$ atoms/$cm^3$ or less and an oxygen concentration of $3 \times 10^{17}$ atoms/$cm^3$ or less, and a high purity silicon produced by the above method characterised by having a residual silicon carbide number of 10/$dm^3$ or less at 100 μm or more as measured by the infrared transmission method (IR-TM) and preferably 5/$dm^3$ or less.

In addition, the present invention is a silicon raw material used in the production of high purity silicon, and is a silicon raw material for producing high purity silicon characterised in that together with possessing a carbon ratio of 100~1000 ppmw it also possesses germanium in a ratio of 0.5~2000 ppmw.

Moreover, in the present invention, preferably, by pioneering heat removal processes for the aforesaid unidirectional solidification, a preservation process for preserving the molten state of the molten silicon in the molding vessel is supplied, and this process it is acceptable to fashion a silicon carbide contact layer of a thickness of 20 μm or more on the inner surface of the molding vessel. By doing this, for example, even if a quartz molding vessel is used, when the molten silicon is being unidirectionally solidified, the silicon carbide layer on the surface of the inner wall of the molding vessel effectively stops the solution of oxygen into the molten silicon, and it is possible to decrease the carbon concentration in the solidified silicon.

Moreover, in the present invention, the area of contact between the surface of the inner wall of the molding vessel and the molten silicon is relatively small in comparison with the volume of the molten silicon, and in the event that it is difficult to transfer silicon carbide that has precipitated in the molten silicon to the surface of the inner wall of the molding vessel using only the natural flow of the molten silicon, then during implementation of the aforementioned molten silicon preservation process, the agitation that provides strong counter currents to the molten silicon inside the molding vessel is carried out, and, after this kind of agitation is implemented, agitation is terminated and that condition is preserved, and as a result of this a silicon carbide layer on the surface of the inner wall of the molding vessel may be produced to the desired thickness.

Additionally, in the present invention, when implementing the process of heat removal from the aforementioned molten silicon, if is preferred that agitation be carried out that provides strong convection currents in the molten silicon raw material in the molding vessel, and by doing this, when unidirectionally solidifying the molten silicon, together with the profession of this unidirectional solidification, the carbon concentration in the molten silicon increases, and even if silicon carbide precipitates in this molten silicon this silicon carbide will be transferred to the surface of the molten silicon or to the surface of the inner wall of the molding vessel and it is possible to prevent to the greatest degree possible its inclusion in the solidified silicon.

In the present invention, in the case of the production of high purity silicon for use in the manufacture of solar cells, with regard to the molten silicon to be used as a raw material, in addition to the matter of it containing carbon at a ratio of 100~1000 ppmw and germanium at a ratio of 0.5~2000 ppmw, together with the concentration of metallic impurities being 1000 ppmw or less, it is preferred to use boron as a dopant. According to the present invention, even when boron is added as the dopant, it is possible to produce high purity silicon that can be used to manufacture superior quality silicon wafers that are not subject to photodegradation.

The Effects of the Invention

According to the high purity silicon production method of the present invention, it is possible to produce high purity silicon with minimal crystalline defects and with low oxygen concentration and low carbon concentration on an industrial scale both easily and at low cost price. For example, it is possible to offer a superior high purity silicon through manufacturing of wafers possessing superior quality that will not photodegrade for use in solar cells and the like. Moreover, when fashioning it into wafers, together with improving the product yield when producing wafers, it is possible to stop the formation of defects due to the increase in leaked current.

BEST MODE FOR IMPLEMENTING THE INVENTION

With regard to the molten silicon of the raw material used in the present, invention, the carbon concentration should be 100 ppmw or more and 1000 ppmw or less and preferably 200 ppmw or more and 500 ppmw or less and the germanium concentration should be 0.5 ppmw or more and 2000 ppmw or less and preferably 50 ppmw or more and 1000 ppmw or less.

When quartz molding vessels are used in unidirectional solidification of molten silicon, even, for example, when a release layer is formed on the surface of the inner wall that is composed of silicon nitride powder, oxygen will be dissolved and taken into the molten silicon. However, in the present invention, because the carbon in the molten silicon is contained at or above equilibrium concentrations (40 ppmw at melting point) super equilibrium carbon is precipitated out as silicon carbide, and the silicon carbide precipitated is partly floated to the surface of the molten silicon and is concentrated in the upper part of the solidified silicon. However, most of it is formed into a silicon carbide contact layer attached to the surface of the inner wall of the molding vessel, and the dissolution of oxygen from the quartz molding vessel into the molten silicon is stopped.

Thus, in the present invention, a silicon carbide contact layer in contact with the surface of the inner wall of the molding vessel is formed, if is necessary that the entire surface of the inner wall of the molding vessel be completely covered by this silicon carbide contact layer, through the goal of forming such a continuous and complete silicon carbide contact layer, a process has been pioneered for heat removal for unidirectional solidification, and it is desirable that there be supplied a preservation process for preserving the molten state of the molten silicon in the molding vessel. Thus, with regard to the thickness of the silicon carbide contact layer formed, there is a considerable variation depending upon the position on the surface of the inner wall of the molding vessel. However, to inhibit the dissolution of oxygen, the thinnest part of that layer must be 20 μm or more thick and preferably 50 μm or more and 2000 μm or less thick, and if the thickness of the thinnest part of the layer is less than 20 μm then there is a concern that the effectiveness of the inhibition of the dissolution of oxygen will be inadequate. On the contrary, when it exceeds 2000 μm the effectiveness of the oxygen dissolution is achieved, but the thickness of every portion other than the thinnest portion is too great and the yield of product is decreased to that, extent.

At this point, because molten silicon normally co-exists with silicon carbide, carbon is dissolved into an equilibrium condition on the molten silicon and oxygen dissolved from the surface of the inner wall of the molding vessel is removed directly as carbon monoxide gas. For the formation of a layer of silicon carbide of this thickness on the surface of the inner wall of the molding vessel, the appropriate carbon concentration in the molten silicon depends upon the ratio of the volume of the molten silicon and the area of the contact between the surface of the inner wall of the molding vessel and the molten silicon. However, it is necessary that there be 100 ppmw or more, and at a greater concentration, 1000 ppmw is sufficient. With regard to the silicon ingot obtained by unidirectional solidification, the upper part where metallic impurities are concentrated is removed, and, additionally, after cutting away the sides and bottom the wafer is sliced to become a solar cell, but if the concentration of carbon contained exceeds 1000 ppmw, in addition for it being easier for silicon carbide to remain within the wafer, the silicon carbide layer formed on the surface of the inner wall of the molding vessel is too thick, and it will be necessary to cut away more of the bottom and sides which will cause a decline in product yield.

On the other hand, because the silicon carbide layer formed on the surface of the inner wall of the molding vessel is formed not only on the sides but also on the bottom of the inner wall of the molding vessel, if there is a production method for unidirectional solidification from the bottom surface of the molding vessel, then the crystal growth during the initial period of silicon solidification will be negatively influenced. Silicon carbide works as a nuclear generation site for silicon crystals and the probability of the generation of crystal grains possessing random grain boundaries will increase. Since random grain boundaries easily become the starting point for crystalline defects, the formation of crystalline defects increases, and the problem arises that together with that the carrier life time declines. Therefore, in the present invention, germanium is added in the ratio of 0.5 ppmw or more and 2000 ppmw or less and by doing this, even if the silicon carbide layer at the bottom surface of the molding vessel is formed, it is possible to manufacture silicon crystals with minimal crystalline defects. The concentration of germanium is preferably 50 ppmw or more, however even if 2000 ppmw or more are added, the effect of inhibiting crystalline defects will not be enhanced, and, on the contrary, the cost of germanium will result in overall cost increases.

In the present, invention, if molten silicon is preserved in a molten state in the molding vessel, the precipitated silicon carbide will be transferred by natural convection currents inside the molding vessel, and the part that arrives at the surface of the molten silicon will float there and the part that arrives at the surface of the inner wall of the molding vessel will adhere and accumulate there. However, in the event that compared to the volume of the molten silicon the area of the contact between the molten silicon and the surface of the inner wall of the molding vessel is small, there are cases where it will be difficult to transfer the silicon carbide precipitated into the molten silicon to the surface of the inner wall of the molding vessel only by process of natural convection currents in the molten silicon. Moreover, in cases of this type, if the silicon carbide remains within the molten silicon, when it solidifies the silicon carbide will remain inside the silicon ingot, and when that, is made into wafers, the product yield will decrease and this will be a cause of the occurrence of defective goods due to an increase in current leaks. For that reason, in the present invention, as necessary, agitation within the molding vessel while preserving the molten state may be carried out, and by doing so, silicon carbide may be transported to the surface of the inner wall of the molding vessel and not remain in the molten silicon and it can be formed into the silicon carbide contact layer on the surface of the inner wall of the molding vessel.

As stated above, it is possible by agitation to form a silicon carbide contact layer on the surface of the inner wall of the molding vessel effectively, but, depending upon the process of agitation, there are cases where closed flows that do not reach the surface of the inner wall of the molding vessel or the surface are achieved, and if silicon carbide enters these currents, the silicon carbide will not arrive at the surface of the molten silicon or the surface of the inner wall of the molding vessel, but will be taken into the solidified silicon ingot. For that reason, in the present invention, depending upon necessity, after conducting agitation for a while the agitation may be stopped and the static condition maintained. The silicon carbide formed inside the molten silicon has a specific gravity larger than that of molten silicon and since the silicon carbide has been made to cluster as a result of agitation, it will easily sink if the agitation is stopped and will attach to the bottom of the molding vessel.

According to the present invention, with regard to the process of preserving the pre-operation of the heat removing process for the unidirectional solidification, the preservation period is normally from 30 minutes or more to 8 hours or less and preferably from one hour or more to 5 hours or less. Moreover, in the event that this preservation process carries out agitation of the molten silicon during the implementation preservation process, those agitation process depend upon the flow speed of forced convection currents produced by this agitation and the ratios of the volume of molten silicon to the contact area of the surface of the inner wall of the molding vessel. However, agitation may normally be carried out from 10 minutes or more to 3 hours or less and preferably from 30 minutes or more to 2 hours or less and, moreover, in the event that with regard to the time after this agitation the agitation is stopped and the stopped condition is maintained, depending upon the height of the molten silicon. However, normally it is from 10 minutes or more to 5 hours or less and preferably from 30 minutes or more to 3 hours or less, if when using the preservation process the preservation time is shorter than 30 minutes, there is a concern that the silicon carbide contact layer will not be a continuous layer and, on the contrary, if the time is longer than 8 hours the silicon carbide contact layer does not thicken and the decline in productivity becomes marked.

After the operating the aforesaid preservation process, the heat removal process is initiated by beginning heat removal for the unidirectional solidification of the molten silicon, but as this heat removal process progresses, then gradually the carbon concentration in the remaining molten silicon increases. Thus, because in the event that the molding vessel is comparatively small, the carbon will float on the surface of the molten silicon or the precipitated silicon carbide that attaches to the surface of the inner walls of the molding vessel will become a carbon sink, the precipitation of new silicon carbide will become more difficult. However, in the event that the molding vessel is large, there are cases where the carbon concentration in the parts far from both the surface of the molten silicon and the surface of the inner walls of the molding vessel will exceed the equilibrium concentration, and new silicon carbide will precipitate. In that case, agitation of the molten silicon in the heat removal process of unidirectional solidification may be applied as needed in the present invention, and by doing this, it is possible to plan the reduction of even more of the carbon concentration in the molten silicon, and even if silicon carbide is formed during the entire heat removal process, it is possible to transfer it to the surface of the molten silicon or the surface of the inner walls of the molding vessel.

As the agitation method for mechanically agitating the molten silicon conducted during the aforesaid preservation process and heat removal process, it is possible to apply such methods as agitation by gas injection, electromagnetic agitation and mechanical agitation. However, from the standpoint of the low cost, of the manufacture of silicon ingots, gas injection agitation is preferred. As the gases used for this purpose, helium, neon, argon, and so on may be chosen, but argon is preferred for the same reason as stated above. As to the operation of gas injection, a lance made of carbon, quartz, or a ceramic-like silicon carbide, silicon nitride or aluminium oxide or the like is inserted into the molten silicon and this lance has an external diameter of from 5 to 30 mm and an internal diameter of from 3 to 20 mm, and gas from the lance is caused to flow through the lance at a rate of from 0.2 liters/minute or more to 5 liters per minute or less, and preferably 0.5 liters/minute or more to 2 liters per minute or less. Moreover, in the event that during the heat removal process, the agitation is carried out by gas injection, this lance may be moved vertically in response to the progress of solidification so that the lance is carefully positioned to avoid penetrating the solidified silicon ingot and is normally maintained in a position 0.5~5 cm from the solidification facet as it rises.

In the present invention, in the event that high purity silicon is produced for use in the manufacture of solar cells, molten silicon having a concentration of metallic impurities at a concentration of 1000 ppmw or less may be used as the raw material, and preferably, boron having a concentration within the scope of 0.05 ppmw or more and 0.5 ppmw or less and preferably 0.1 ppmw or more and 0.3 ppmw or less may be used as the dopant. According to the present invention, by using this kind of silicon raw material, moreover, even in the event that boron is added as a dopant, a high purity silicon from which a superior quality, minimal photodegradation silicon wafer for use as a solar cell can be manufactured easily at low cost and on an industrial scale.

PRACTICE EXAMPLES

Below, based on the practice examples and comparative examples, the method of producing high purity silicon of the present invention and the high purity silicon obtained by this method together with the silicon raw material for use in producing the high purity silicon used in this method will be explained in detail.

Practice Example 1

To a silicon raw material having a carbon concentration (C concentration) of 150 ppmw, a germanium concentration (Ge concentration) of 1 ppmw and a metallic impurities concentration of 0.1 ppmw or less was added 0.1 ppmw of boron (B) as a dopant to make 10 kg of silicon raw material.

In addition, to the surface of the inner wall of a quartz molding vessel having internal dimensions of 185 mm×185 mm×200 mm was applied a coating of release agent composed of silicon nitride powder, and after that the aforementioned silicon raw material was placed in said molding vessel and then it was heated to 1500° C. to melt the silicon raw material. While maintaining the molten silicon produced in a molten state, the temperature was maintained at 1 hour at 1450° C. (preservation process).

Next, to solidify the molten silicon in the molding vessel unidirectionally, heat extraction was initiated from the bottom part of the molding vessel, and solidification was made to progress gradually in the direction from bottom to fop to produce a silicon ingot (heat extraction process)

The silicon ingot produced in this way had the outermost portions cut away, to the extent of about 15 mm from the top, 15 mm from the lower solidification direction (the bottom part) and 15 mm from the surface to provide a silicon block of dimensions 155 mm×155 mm×98 mm. When creating this silicon block from the silicon ingot, the part from the lower end of the solidification direction (the bottom part) and sections of the surrounding parts were examined for silicon carbide contact layers by microscope and the continuity of those layers and their minimum thickness were determined. Moreover, one direction of the silicon block obtained was irradiated with infrared radiation and by taking photographs using an infrared camera from another direction, to that through which the infrared was transmitted, an infrared transmission method test (IR-TM) was used to investigate the degree to which silicon carbide was still present. The number for the amount of silicon carbide remaining per unit volume was calculated. In addition, measurements were taken from 25%, 50% and 85% from the low portion of the silicon block obtained [evaluation position: expressed in terms of the ratio to the total height of the silicon ingot (before cutting away the bottom)] and in the horizontal direction 3×10 mm test slabs were cut and the 3 slabs obtained were made sample slabs, and by the microwave photoconductivity decay method (μ-PCD method) carrier lifetime, an indicator of defect density, was determined. In addition, sample strips of 20 mm×20 mm with a thickness of 3 mm were cut from each sample slab's central region and measured for carbon content and oxygen content by Fourier Transform Infrared Spectroscopy (FT-IR).

Moreover, since the carrier lifetime depends upon the concentration of boron which is the carrier generator, the concentration of metallic impurities and the defect, density, the boron concentration is the same and since it is possible to ignore the concentration or metallic impurities if is possible to make a relative comparison of the defect density according to the carrier lifetime. Thus, acid etching is applied to the sample slab obtained by cutting horizontally at the position 25% from the bottom of the silicon ingot obtained in Comparative Example 1 below, and the defective portions are extracted, and the carrier lifetime of 5 locations where there were no defects is measured. The average value is designated $LT_{max}$ and the value of the ratio with the average value of carrier lifetime determined by measuring this $LT_{max}$ value for 5 locations at each height position (evaluation positions) was sought and was evaluated as the in-plane average value ratio. In addition, the average value sought for each of these in-plane average value ratios sought in turn for each of these high positions (evaluation positions) was sought and evaluated. With regard to the carrier lifetime, because there is influence from the diffusion of metallic impurities from the release agent in the vicinity of the contact with the surface of the inner wall of the molding vessel, the in-plane average value is sought while excluding that part. The results are shown in Table 1.

In addition, with regard to the aforementioned infrared transmission test (IR-TM), these were conducted in accordance with the methods recorded in "Proc 25 th EU PV5EC (2010) pp 1624," and, moreover, with regard to the microwave photoconductivity decay method (μ-PCD method) that was conducted in accordance with the methods recorded in "Kobe Seiko Gihou Vol. 52, No. 2, pp 87-93 (September 2002)" and further, with regard to the Fourier Transform infrared Spectroscopy method (FT-IR) that was conducted in accordance with the methods recorded in the "Kanagawa Prefecture Industrial Technology Centre Research Report No. 15/2009, pp 19-23".

Comparative Example 1

As a comparison, only boron was added as a dopant at a ratio of 0.1 ppmw to a silicon raw material with a concentration of metallic impurities of 0.1 ppmw or less, and otherwise the Comparative Example was carried out in the same manner as Practice Example 1. The results are shown in Table 1.

Comparative Example 2

As a further comparison, germanium at a ratio of 0.3 ppmw and boron was added as a dopant at a ratio of 0.1 ppmw to a silicon raw material with a concentration of metallic impurities of 0.1 ppmw or less and otherwise the Comparative Example was carried out in the same manner as Practice Example 1. The results are shown in Table 1.

From the comparison of Practice Example 1 and Comparative Examples 1 and 2 shown in Table 1, in Practice Example 1 of the present invention there is no increase in the carbon or oxygen concentrations and if is possible to decrease the oxygen concentration and as a result it is observed that a silicon ingot with a high carrier lifetime was obtained.

Practice Example 2

Other than adding boron as the dopant in the ratio of 0.3 ppmw, a silicon ingot was prepared in the same manner as in the aforementioned Practice Example 1, and an evaluation was conducted. With regard to photodegradation, the sample slab from the position 25% of the height obtained from the silicon ingot obtained in Example 2 is used and after measuring the carrier lifetime, the carrier lifetime is measured after irradiating with a 200 mW/cm² halogen lamp for fen minutes and an investigation is made comparing the surface infernal average values before and after this exposure.

Comparative Example 3

As a comparison, only boron was added as a dopant at a ratio of 0.3 ppmw to a silicon raw material with a concentration of metallic impurities of 0.1 ppmw or less, and otherwise the Comparative Example was carried out in the same manner as Practice Example 2. The results are shown in Table 1.

In this Comparative Example 3, compared with Practice Example 2, the carrier lifetime greatly decreases after irradiation, and in the event that this is incorporated into a solar cell as silicon raw material, the conversion rate (electric power obtained) is broadly reduced by use over a short period.

Practice Example 3

To a silicon raw material with a carbon concentration (C concentration) of 400 ppmw, a germanium concentration (Ge concentration) of 200 ppmw, and a concentration of metallic impurities of 0.1 ppmw or less, was added the dopant boron (B) only at a ratio of 0.15 ppmw, to prepare 400 kg of silicon raw material.

Moreover, after coating the surface of the inside wall of a quartz molding vessel of internal dimensions 850 mm×850 mm×400 mm with a release agent of silicon nitride powder, the aforementioned silicon raw material was introduced into the molding vessel and then heat was added at a temperature of 1500° C. to melt the silicon raw material, after which the inside of this mold was penetrated from above by a carbon lance with an external diameter of 12.5 mm and an internal diameter of 6 mm so the tip would remain in a position 50 mm above the bottom of the molding vessel, and through this carbon lance was injected argon gas at a flow rate of 1 liter/minute (Ar injection) and agitation of the molten silicon in the molding vessel was conducted for 1 hour. After that, the argon flow was terminated and the molten condition of the molten silicon was preserved in that manner for 3 hours (preservation process).

Then, to implement unidirectional solidification of the molten silicon in the molding vessel, the removal of heat from this molding vessel was initiated, and from bottom to top unidirectional solidification was gradually effected, and a silicon ingot was produced (heat removal process). During this time, at the point when 50% of the silicon raw material is solidified, the flow of argon gas through the lance is initiated and while adjusting so that the tip of the lance is normally in a position of on the order of 20 mm above the solidified surface, the flow of argon is continued until 90% of the silicon raw material has solidified.

With regard to the silicon ingot produced in this way after the outermost portions were cut away to the extent of about 20 mm from the peripheral parts of the ingot, silicon blocks of horizontal area 155 mm×155 mm was cut in the direction of solidification, and next, from each of the blocks obtained were cut 15 mm from the top and 20 mm from the bottom to obtain 25 blocks of a size of 155 mm×155 mm×a height of 205 mm. With regard to each of the blocks thus obtained, the oxygen content, the carbon content, the silicon carbide content and the carrier lifetime were determined in the same manner as in Practice Example 1.

With regard to the carrier lifetime, a silicon ingot was prepared, produced under conditions the same as in Practice Example 1 except that to 10 kg of silicon raw material with a metallic impurity concentration of 0.1 ppmw or less were added only 0.15 ppmw of boron as dopant, and seeking the lifetime average value ($LT_{max}$) using the same methods as were used to seek it in Practice Example 1, this $LT_{max}$ value and that for a total of 3 silicon blocks comprising a central block and those taken from either side that are from a position in the centre of the aforementioned cut silicon blocks were sought and the ratio of the surface internal average value of the carrier lifetimes obtained was sought and evaluated as the surface internal average value ratio. In addition, the average value of the surface internal average value ratio for each of these height positions (evaluation positions) was sought and evaluated. Moreover, with regard to the quantity of residual silicon carbide, among the values measured for the 25 blocks, the largest number for a single block was sought, and the quantity for the residual silicon carbide per unit volume was calculated. The results are shown in Table 1.

Practice Example 4

Except for the use of a silicon raw material whereby to a silicon raw material with a carbon concentration (C concentration) of 400 ppmw, a germanium concentration (Ge concentration) of 30 ppmw and a metallic impurity concentration of 0.1 ppmw or less, was added a dopant only of boron (B) in the concentration of 0.15 ppmw, the example was carried out the same as Practice Example 3 above and a silicon ingot was prepared and measurements were taken for the oxygen concentration, the carbon concentration, the residual silicon carbide concentration and the carrier lifetime. The results are shown in Table 1.

Practice Example 5

Except for the use of a silicon raw material whereby to a silicon raw material with a carbon concentration (C concentration) of 1000 ppmw, a germanium concentration (Ge concentration) of 2000 ppmw and a metallic impurity concentration of 0.1 ppmw or less, was added a dopant only of boron (B) in the concentration of 0.15 ppmw, the example was carried out the same as Practice Example 3 above and a silicon ingot was prepared and measurements were taken for the oxygen concentration, the carbon concentration, the residual silicon carbide concentration and the carrier lifetime. The results are shown in Table 1.

Comparative Example 4

In comparison, using 400 kg of a silicon raw material with a carbon concentration (C concentration) of 400 ppmw and a metallic impurity concentration of 0.1 ppmw or less, was added a dopant only of boron in the concentration of 0.15 ppmw, except that after melting the silicon raw material it was preserved for 4 hours without injecting argon gas, and argon gas was not injected during heat removal, the Comparative Example was carried out the in the same manner as in Practice Example 3 above, a silicon ingot was prepared by unidirectional solidification, and evaluation was conducted in the same manner as in Practice Example 3. The results are shown in Table 1.

From the comparison of Practice Example 3 and Comparative Example 4 shown in Table 1, it is observed that in Comparative Example 4, the carbon concentration is high and there is a larger amount of residual silicon carbide. Moreover, in the upper part of the silicon ingot, silicon carbide was observed in several bands, and, additionally, it was observed that due to the carbon concentration and residual silicon carbide the carrier lifetime would be reduced as well.

Comparative Example 5

Except for the use of a silicon raw material whereby to a silicon raw material with a carbon concentration (C concentration) of 80 ppmw, a germanium concentration (Ge concentration) of 200 ppmw and a metallic impurity content of 0.1 ppmw or less, was added a dopant only of boron (B) in the concentration of 0.15 ppmw, the example was carried out the same as Example 3 above and a silicon ingot was prepared and measurements were taken for the oxygen concentration, the carbon concentration, the residual silicon carbide concentration and the carrier lifetime. The results are shown in Table 1.

The invention claimed is:

1. A method for producing high purity silicon characterised in that it is a method of high purity silicon production that produces high purity silicon by unidirectional solidification of raw material molten silicon in a molding vessel, and uses as said raw material molten silicon that has a carbon concentration of 100~1000 ppmw, and a germanium concentration of 50-1000 ppmw wherein a heat extraction process drives said unidirectional solidification forward, a preservation process is provided to preserve the molten state of the molten silicon in the molding vessel and by this preservation process, a silicon carbide contact layer of 20 μm thickness or more is formed on the surface of the inner wall of the molding vessel.

2. A method for producing high purity silicon according to claim 1, wherein during the preservation process of said molten silicon, agitation is applied to force convection currents in the molten silicon in the molding vessel.

3. A method for producing high purity silicon according to claim 2, wherein during the heat extraction process from said molten silicon, agitation is carried out to provide convection currents in the molten silicon in the molding vessel.

4. A method for producing high purity silicon according to claim 2, wherein said high purity silicon is silicon for solar cell use, and the raw material molten silicon together with metallic impurity concentration being 1000 ppmw or less contains boron as a dopant.

TABLE 1

| | Concentration of impurities in molten silicon (ppmw) | | | | Properties of SiC contact layer (*2) | Silicon ingot evaluation | | | | | Career lifetime before and after light irradiation (in-plane average value ratio) | |
|---|---|---|---|---|---|---|---|---|---|---|---|---|
| | C | Ge | B | (*1) | | Evaluation position (%) | O concentration ($\times 10^{17}$) | C concentration ($\times 10^{17}$) | Residual SiC (Unit/dm$^3$) | LTmax | Before (average value) | After |
| Practice Example 1 | 150 | 1 | 0.1 | <0.1 | Continuity: 40 | 25 | 2.1 | 4.3 | 0.9 | 6.8 | 91 | 89.3 |
| | | | | | | 50 | 1.7 | 5.0 | | | 89 | |
| | | | | | | 85 | 1.5 | 3.7 | | | 38 | |
| Comparative Example 1 | 0 | 0 | 0.1 | <0.1 | None | 25 | 10.3 | 4.5 | 0.4 | | 92 | 83.3 |
| | | | | | | 50 | 8.2 | 4.8 | | | 83 | |
| | | | | | | 85 | 3.5 | 4.0 | | | 75 | |
| Comparative Example 2 | 150 | 0.3 | 0.1 | <0.1 | Continuity: 40 | 25 | | | | | 77 | 80.0 |
| | | | | | | 50 | | | | | 85 | |
| | | | | | | 85 | | | | | 78 | |
| Practice Example 2 | 150 | 1 | 0.3 | <0.1 | Continuity: 40 | 25 | 2.5 | | | 5.4 | | 93 |
| Comparative Example 3 | 0 | 0 | 0.3 | <0.1 | None | 25 | 9.8 | | | | | 72 |
| Practice Example 3 | 400 | 200 | 0.15 | <0.1 | Continuity: 50 | 25 | 0.8 | 5.1 | 0.8 | 6.1 | 94 | 92.0 |
| | | | | | | 50 | 1.0 | 6.8 | | | 92 | |
| | | | | | | 85 | 0.9 | 3.3 | | | 90 | |
| Practice Example 4 | 400 | 30 | 0.15 | <0.1 | Continuity: 50 | 25 | | | | | 89 | 85.0 |
| | | | | | | 50 | | | | | 85 | |
| | | | | | | 85 | | | | | 81 | |
| Practice Example 5 | 1000 | 2000 | 0.15 | <0.1 | Continuity: 120 | 25 | 1 | 6.2 | 3.0 | | 90 | 86.7 |
| | | | | | | 50 | 0.9 | 8.8 | | | 86 | |
| | | | | | | 85 | 1.1 | 5.6 | | | 84 | |
| Comparative Example 4 | 400 | 0 | 0.15 | <0.1 | Continuity: 35 | 25 | 2.6 | 8.7 | 24.4 | | 73 | 72.7 |
| | | | | | | 50 | 2.2 | 12.4 | | | 80 | |
| | | | | | | 85 | 1.3 | 5.6 | | | 65 | |
| Comparative Example 5 | 80 | 200 | 0.15 | <0.1 | Non-continuity | 25 | 5.8 | 5.3 | 0.8 | | 91 | 82.7 |
| | | | | | | 50 | 4.1 | 6.4 | | | 83 | |
| | | | | | | 85 | 2.8 | 7.2 | | | 74 | |

(Note)
*1: metallic impurity;
*2: continuity and minimum thickness (μm) of SiC contact layer 5. A method for producing high purity silicon according to claim 1, wherein during the preservation process of said molten silicon, agitation is applied to force convection currents in the molten silicon in the molding vessel, and after the agitation is applied, the agitation is stopped and this stoppage is maintained.

6. A method for producing high purity silicon according to claim 5, wherein during the heat extraction process from said molten silicon, agitation is carried out to provide convection currents in the molten silicon in the molding vessel.

7. A method for producing high purity silicon according to claim 1, wherein during the heat extraction process from said molten silicon, agitation is carried out to provide convection currents in the molten silicon in the molding vessel.

8. A method for producing high purity silicon according to claim 5, wherein said high purity silicon is silicon for solar cell use, and the raw material molten silicon together with metallic impurity concentration being 1000 ppmw or less contains boron as a dopant.

9. A method for producing high purity silicon according to claim 1 wherein said high purity silicon is silicon for solar cell use, and the raw material molten silicon together with metallic impurity concentration being 1000 ppmw or less contains boron as a dopant.

10. A method for producing high purity silicon according to claim 7, wherein said high purity silicon is silicon for solar cell use, and the raw material molten silicon together with metallic impurity concentration being 1000 ppmw or less contains boron as a dopant.

* * * * *

UNITED STATES PATENT AND TRADEMARK OFFICE
CERTIFICATE OF CORRECTION

PATENT NO. : 10,167,199 B2
APPLICATION NO. : 14/383321
DATED : January 1, 2019
INVENTOR(S) : Shinji Tokumaru et al.

Page 1 of 1

It is certified that error appears in the above-identified patent and that said Letters Patent is hereby corrected as shown below:

On the Title Page

Item (57) Column 2, Line 1, delete "a highly" and insert -- highly --

In the Specification

Column 1, Line 9, delete "Thia" and insert -- This --

Column 1, Line 15, delete "2013/132029 A1," and insert -- 2013/132629 A1, --

Signed and Sealed this
Twenty-sixth Day of March, 2019

Andrei Iancu
*Director of the United States Patent and Trademark Office*